United States Patent
Tang et al.

(10) Patent No.: US 11,276,720 B2
(45) Date of Patent: Mar. 15, 2022

(54) OPTICAL PACKAGE

(71) Applicant: Advanced Semiconductor Engineering, Inc., Kaohsiung (TW)

(72) Inventors: Shih-Chieh Tang, Kaohsiung (TW); Lu-Ming Lai, Kaohsiung (TW); Chia Yun Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/670,836

(22) Filed: Oct. 31, 2019

(65) Prior Publication Data

US 2021/0134857 A1    May 6, 2021

(51) Int. Cl.
*H01L 27/146* (2006.01)

(52) U.S. Cl.
CPC .... *H01L 27/1462* (2013.01); *H01L 27/14627* (2013.01)

(58) Field of Classification Search
CPC .......... H01L 27/1462; H01L 27/14627; H01L 27/14685
See application file for complete search history.

(56) References Cited

U.S. PATENT DOCUMENTS

| | | | |
|---|---|---|---|
| 6,586,811 B2 | 7/2003 | Sekine | |
| 7,968,923 B2 | 6/2011 | Nagaraja et al. | |
| 8,766,158 B2* | 7/2014 | Arase | G02B 3/0012 250/208.1 |
| 9,064,763 B2* | 6/2015 | Ozawa | H01L 27/14629 |
| 9,935,146 B1 | 4/2018 | Lee | |
| 2001/0051405 A1* | 12/2001 | Sekine | H01L 27/14627 438/208 |
| 2005/0224694 A1* | 10/2005 | Yaung | H01L 27/14627 250/208.1 |
| 2018/0213205 A1 | 7/2018 | Oh | |

FOREIGN PATENT DOCUMENTS

| | | |
|---|---|---|
| CN | 207338378 U | 5/2018 |
| TW | 543196 B | 7/2003 |
| TW | 200533958 A | 10/2005 |

OTHER PUBLICATIONS

Office Action for corresponding Taiwanese Patent Application No. 109105613 with English Summary, dated Dec. 15, 2021, 4 pages.
Search Report for corresponding Taiwanese Patent Application No. 109105613, dated Dec. 15, 2021, 1 page.

* cited by examiner

*Primary Examiner* — Dale E Page
*Assistant Examiner* — Wilner Jean Baptiste
(74) *Attorney, Agent, or Firm* — Foley & Lardner LLP

(57) ABSTRACT

An optical package includes a substrate, an image sensor, a microlens, an optical filter layer, a constraining layer, and a buffer layer. The image sensor is disposed on the substrate. The microlens having a first Young's modulus is disposed on the image sensor. The optical filter layer having a second Young's modulus disposed on the microlens. The constraining layer is disposed between the optical filter layer and the microlens. The buffer layer having a third Young's modulus disposed on the constraining layer. The third Young's modulus is greater than the first Young's modulus and smaller than the second Young's modulus.

19 Claims, 4 Drawing Sheets

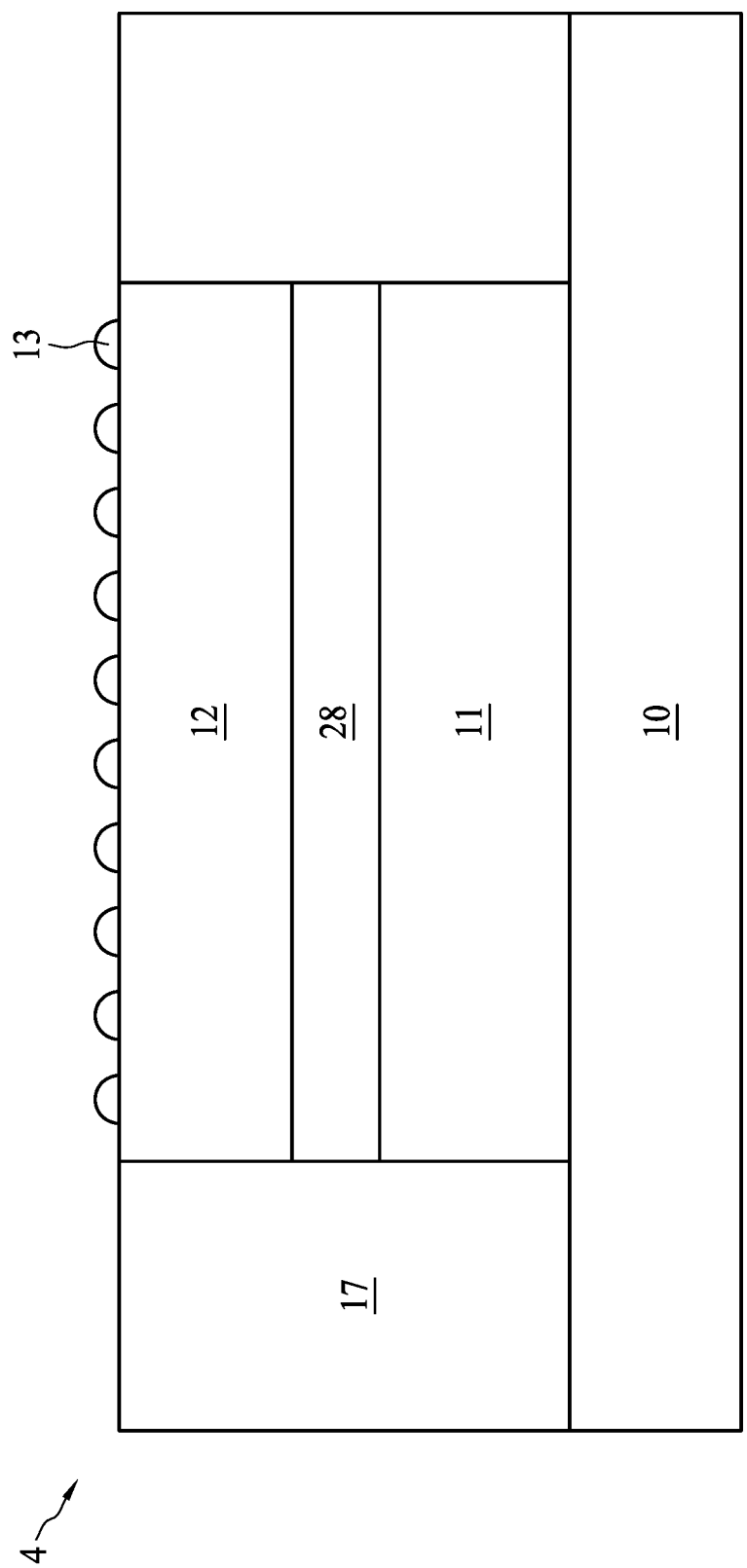

OPTICAL PACKAGE

BACKGROUND

1. Technical Field

The present disclosure generally relates to an optical package, and, in particular, to an optical package having an optical filter layer.

2. Description of the Related Art

In the modern semiconductor packaging, it is desired to shrink the package size. However, an optical package including an optical filter glass to filter the unwanted light may have a relatively great thickness. The optical filter glass plays an important role in the optical package but generally has a thickness greater than 200 µm which is not aligned with the development for the application in the ever-thinning trend of the optical package.

SUMMARY

In one or more embodiments, an optical package comprising a substrate, an image sensor, a microlens, an optical filter layer, a constraining layer, and a buffer layer. The image sensor is disposed on the substrate. The microlens having a first Young's modulus is disposed on the image sensor. The optical filter layer having a second Young's modulus disposed on the microlens. The constraining layer is disposed between the optical filter layer and the microlens. The buffer layer having a third Young's modulus disposed on the constraining layer. The third Young's modulus is greater than the first Young's modulus and smaller than the second Young's modulus.

In one or more embodiments, an optical package comprising a substrate, an image sensor, a microlens, and an optical filter layer. The image sensor is disposed on the substrate. The microlens is disposed on the image sensor. The optical filter layer comprises a laminating structure with repeating units of a first layer and a second layer. A grain size of the first layer in a first repeating unit is greater than a grain size of the first layer in subsequent repeating units.

In one or more embodiments, an optical package comprising a substrate, an image sensor, a microlens, an optical filter layer, and a buffer layer. The image sensor is disposed on the substrate. The microlens having a first Young's modulus is disposed on the image sensor. The optical filter layer having a second Young's modulus disposed on the microlens. The buffer layer having a third Young's modulus disposed between the optical filter layer and the microlens. The third Young's modulus is greater than the first Young's modulus and smaller than the second Young's modulus.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 4 illustrates a cross-sectional view of an optical package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
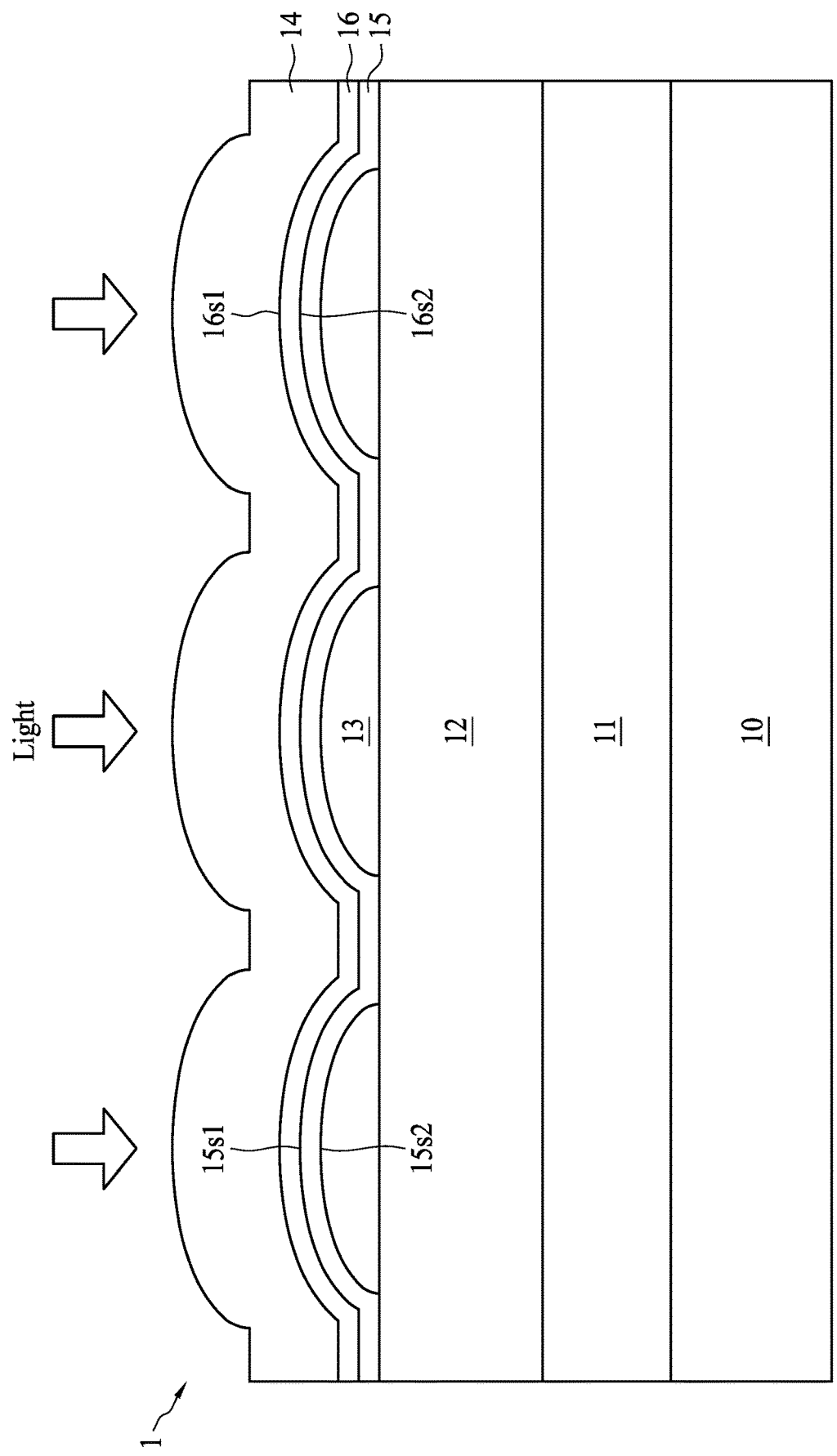
FIG. 1 illustrates a cross-sectional view of an optical package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

The present disclosure provides an optical package including a substrate, an image sensor, a microlens, an optical filter layer, a constraining layer, and a buffer layer to reduce the thickness of the optical device and improve the light filtering efficiency. The microlens (e.g., composed of epoxy or polymers) possesses a small Young's modulus and large CTE due to its soft nature. The optical filter layer (e.g., composed of metal oxides) possesses a large Young's modulus and smaller CTE due to its hard nature. Depositing the optical filter layer directly over the microlens inevitably induces crack or delamination as a result of modulus and CTE mismatch. Moreover, the curved surface of the microlens leads to greater difficulties in the aforesaid deposition because the deposited layers bear a greater strain over the curved surface than a flat surface. The present disclosure provides one or more interfacial layers between the microlens and the optical filter layer in order to provide better adhesion between the two layers even under the condition of depositing over a curved surface.

FIG. 1 illustrates a cross-sectional view of an optical package 1 in accordance with some embodiments of the present disclosure. Referring to FIG. 1, the optical package 1 comprises a substrate 10, an image sensor 11, a collimating layer 12, a microlens 13, an optical filter layer 14, a constraining layer 15, and a buffer layer 16.

As shown in FIG. 1, a plurality of arrows indicates the direction of incident light, which may be reflected by an object, for example, but not limited to, user's finger, face, or eyes. The incident light may transmit, in sequence, through the optical filter layer 14, the buffer layer 16, the constraining layer 15, the microlens 13, and the collimating layer 12, and then be detected by the image sensor 11.

The substrate 10 may be a lead frame, an organic substrate, a semiconductor substrate, a glass substrate, a ceramic substrate, an embedded substrate, a die with active components formed thereon, or other suitable substrates. The image sensor 11 is disposed on the substrate 10. The image sensor 11 has a plurality of pixels and each of the pixels receives the incident light from a portion of the object. The image sensor 11 may be electrically connected to the die of the substrate 10 via a wiring structure or an interposer. The die of the substrate 10 may transform an optical signal received by the image sensor 11 to an electrical signal.

The collimating layer 12 disposed on the image sensor 11 collimates the incident light from the object so that the collimated light from a portion of the object would align with the associated pixel in the image sensor 11. Thus, the collimating layer 12 can focus the incident light from a greater area to a smaller area on the associated pixel in the image sensor 11 and avoid the cross talk between adjacent pixels. In a comparative embodiment where no microlens 13 is presented in the optical package 1, the collimating layer 12 may have a relatively great thickness to effectively collimate the light. In some embodiments of the present disclosure, to reduce the thickness of the collimating layer 12, for example, by half, the microlens 13 can be disposed on the thinner collimating layer 12 and achieve comparable light collimating effect. The microlens 13 has a curved surface and a width-to-height ratio in a range of from about 6 and 7. For example, each of the microlens 13 may have a semi-hemispherical shape with a diameter of the bottom surface at about 20 μm and a dome height of about 3 μm. In some embodiments, the curvature created at the top surface of the microlens 13 increases the difficulties of subsequent optical filter layer deposition, as previously addressed.

In some embodiments, microlens 13 and the collimating layer 12 may be collectively referred to as an optical engine which controls the direction and the spatial cross section of incident light. Besides, the material of the collimating layer 12 and the microlens 13 may each include a transparent material to incident light, an organic material, or a polymer material (e.g., epoxy). Therefore, the microlens 13 possesses a small Young's modulus and large Coefficient of Thermal Expansion (CTE) due to its soft nature. In some embodiments, the microlens 13 may have a CTE in the range from about 60 ppm/° C. to about 300 ppm/° C. and a Young's in the range of from about 0.2 GPa to about 3 GPa.

Depending on the application of the optical package, the optical package can be designed to have a high sensitivity to one or more specific wavelengths, which may fall within the range of, for example, ultraviolet (UV) light, visible light or infrared (IR) light. In some comparative embodiments, an optical package may include an optical filter glass over the optical engine to filter the incident light with wavelengths falling within an unwanted range so that an image sensor of the optical package receives the light with wavelengths associated with the application of the optical package. The optical filter glass normally has a thickness greater than about 200 μm or in a range from about 300 μm to about 400 μm, which is not aligned with the development for the application in the ever-thinning trend of the optical package. To solve this issue, the optical filter layer 14, instead of optical filter glass, is used in the optical package 1 in the present disclosure. The optical filter layer 14 having a thickness, for example, less than or equal to about 5 μm, significantly reduces the total thickness of the optical package 1 as compared to the comparative embodiments. In some embodiments, the thickness of the optical filter layer 14 may be less than or equal to about 10 μm.

As shown in FIG. 1, the optical filter layer 14 is disposed on and conform to the curved surface of the microlens 13. The optical filter layer 14 may include a laminating structure to improve the light filtering efficiency. The laminating structure includes a first layer having a first refractive index and a second layer having a second refractive index, and the first refractive index is different from the second refractive index. The combination of the first layer and the second layer function to filter the incident light falls within unwanted wavelength range but allow the light falls within target wavelength range to transmit through the optical filter layer 14. In addition to the first layer and the second layer, the laminating structure may further include extra layers repeating the laminating cycle of the first layer and the second layer. For example, the laminating structure may include more than 30 laminating cycles. In some embodiments, the laminating structure may include more than 50 laminating cycles. Furthermore, the optical filter 14 may include, for example, a monochromatic filter, a UV pass filter, an IR cut filter, a long pass filter, a short pass filter, or a bandpass filter. The material of the first layer may include, for example, $TiO_2$, $Nb_2O_5$, $Ta_2O_3$ or other oxide materials. The material of the second layer may include, for example, $MgF_2$, $SiO_2$ or other oxide materials. Compared to the microlens 13, the optical filter layer 14 possesses a greater Young's modulus and a smaller CTE due to its hard nature. In some embodiment, the optical filter layer 14 may have a CTE of about 3 ppm/° C. or less and a Young's modulus of about 60 GPa or greater.

The Young's modulus and CTE mismatch between the microlens 13 and the optical filter layer 14 induces crack or delamination when depositing the optical filter layer directly over the microlens. Moreover, the curved surface of the microlens leads to greater difficulties in the aforesaid deposition because the deposited layers bear a greater strain over the curved surface than a flat surface. In the present disclosure, the constraining layer 15 and the buffer layer 16 disposed between the optical filter layer 14 and the microlens 13 provide better adhesion between the two layers even under the condition of depositing over the curved surface of the microlens 13. Compared to the microlens 13, the constraining layer 15 has a greater Young's modulus and a smaller CTE, and hence the constraining layer 15 serves the purpose of constraining the thermal expansion of the underlying microlens 13. In contrast, the buffer layer 16 disposed on the constraining layer 15 has a smaller Young's modulus than that of the constraining layer 15, the stress transferring from the microlens 13 to the optical filter layer 14 may be buffered by this mechanically softer layer. By interposing the constraining layer 15 and the buffer layer 16, the optical filter layer 14 can be disposed over the microlens 13 without any crack or delamination, resulting in that the optical filter layer 14 being conformal to a topography of the microlens. The optical filter layer 14, the constraining layer 15 and the buffer layer 16 collectively provide an optical filter structure having a thickness of from about 5 μm to about 10 μm. Therefore, the total thickness of the optical package can be significantly reduced as compared to the comparative embodiments where a 200 μm optical filter glass is implemented.

The constraining layer 15 is conformal to the topography of the microlens 13 and the buffer layer 16 is conformal to a topography of the constraining layer 15 and in turn to the topography of the microlens 13. As shown in FIG. 1, the constraining layer 15 includes a top surface 15s1 and a bottom surface 15s2 opposite to the top surface 15s1. The top surface 15s1 and the bottom surface 15s2 are conformal to the topography of the microlens 13. The buffer layer 16 having a top surface 16s1 and a bottom surface 16s2 opposite to the top surface 16s1, both the top surface 16s1 and the bottom surface 16s2 conform to a topography of the microlens 13.

The Young's modulus of the constraining layer 15 can be greater than that of the microlens 13. The Young's modulus of the constraining layer 15 is closer to the Young's modulus of the optical filter layer 14 than that of the microlens 13. The Young's modulus of the constraining layer 15 may be, for example, greater than or equal to about 60 GPa. The CTE of the constraining layer 15 can be smaller than that of the microlens 13. The CTE of the constraining layer 15 can be closer to a CTE of the optical filter layer 14 than that of the microlens 13. The CTE of the constraining layer 15 may be, for example, less than or equal to about 3 ppm/° C. In some embodiment, the constraining layer 15 has a thickness less than or equal to about 100 nm. In some embodiment, the constraining layer 15 has a thickness less than or equal to about 50 nm. The material of the constraining layer 15 may include, for example, but not limited to, semiconductor oxides or metal oxides.

The Young's modulus of the buffer layer 16 can be greater than that of the microlens 13 and smaller than that of the optical filter layer 14. The Young's modulus of the buffer layer 16 may be, for example, about 30 GPa. A CTE of the buffer layer 16 can be less than that of the microlens 13. The CTE of the buffer layer 16 may be, for example, in a range from about 1 ppm/° C. to about 4 ppm/° C. In some embodiments, the CTE of the buffer layer 16 may be greater than or equal to about 3 ppm/° C. In some embodiment, the buffer layer 16 has a thickness of about 30 nm. The material of the buffer layer 16 may include, for example, but not limited to, doped metal oxide, or other suitable materials which can be deposited with a grain size large enough to match the desired Young's modulus previously described.

In some embodiments, the constraining layer 15 illustrated in FIG. 1 can be omitted. The present disclosure provides an optical package comprising a substrate 10, an image sensor 11, a collimating layer 12, a microlens 13, an optical filter layer 14, and a buffer 16 as illustrated in FIG. 1. The buffer layer 16 disposed between the optical filter layer 14 and the microlens 13 served as an interfacial layer providing better adhesion between the two layers. A Young's modulus of the buffer layer 16 is greater than that of the microlens 13 and smaller than that of the optical filter layer 14. In some embodiment, a CTE of the microlens 13 is greater than a CTE of the buffer layer 16. In the embodiment omitting the constraining layer 15, Young's modulus of the first layer and/or the second layer in the laminating structure of the optical filter layer 14 can be adjusted to be lower than that in the embodiment having the constraining layer 15. In some embodiments, the adjustment of the Young's modulus of the first layer and/or the second layer in the laminating structure of the optical filter layer 14 can be achieved, for example, by tuning film deposition parameters so that a layer with desired mechanical property, e.g., Young's modulus, can be obtained.

Figure 2:
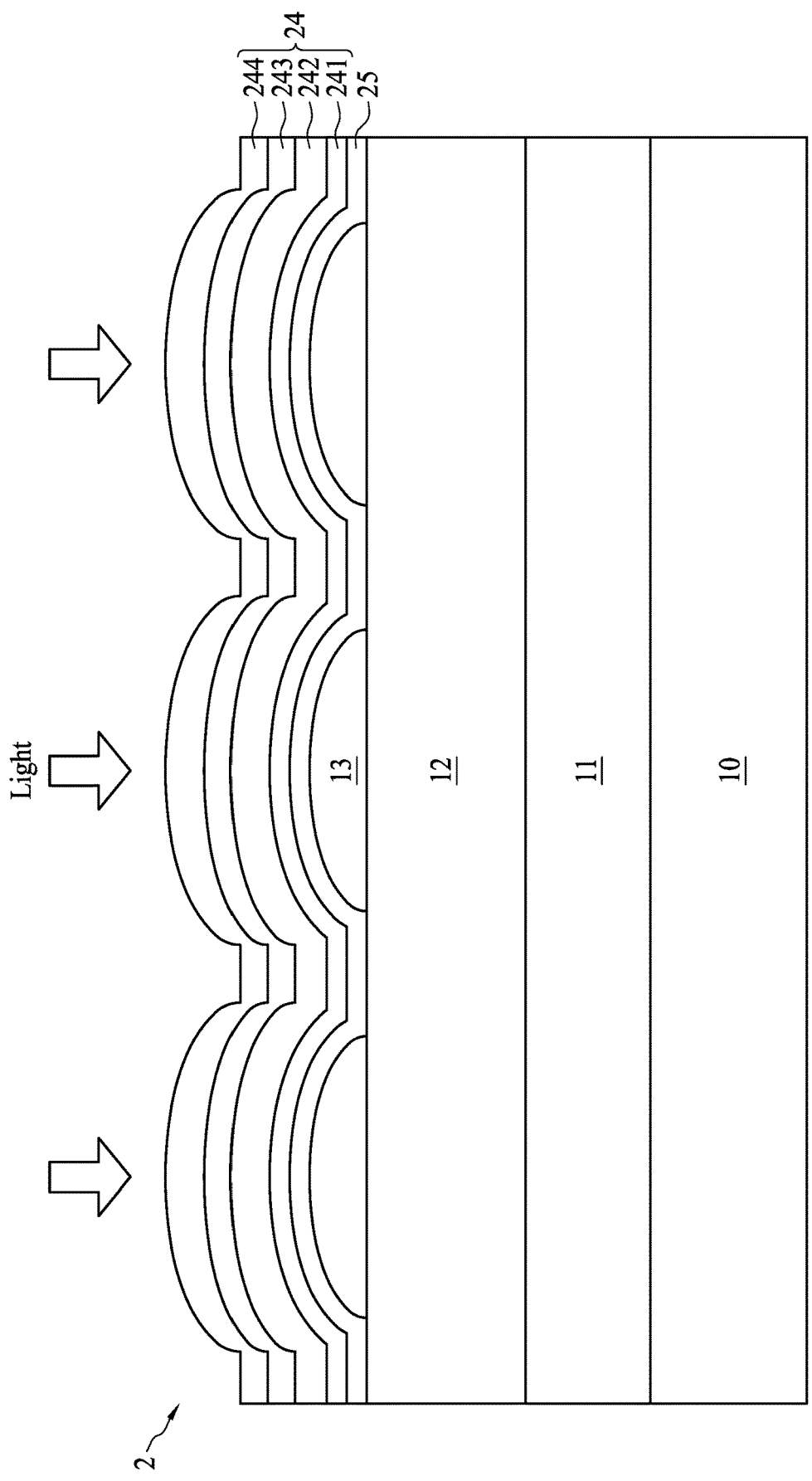
FIG. 2 illustrates a cross-sectional view of an optical package in accordance with some embodiments of the present disclosure.

FIG. 2 illustrates a cross-sectional view of an optical package 2 in accordance with some embodiments of the present disclosure. Referring to FIG. 2, the optical package 2 is similar to the optical package 1 in FIG. 1 except that, for example, the buffer layer 16 can be omitted. As illustrated in more detail in FIG. 2, each sub-layers of the optical filter layer 24 has a curve surface conformal to a topography of the microlens 13. In some embodiments, the optical filter layer 24 may be in contact with the microlens 13. The optical filter layer 24 includes a laminating structure with a first unit having a first layer 241 and a second layer 242. The laminating structure further including a second unit having a first layer 243 and a second layer 244. As previously described, the first layers 241 and 243 have a first refractive index, the second layers 242 and 244 have a second refractive index, and the first refractive index is different from the second refractive index.

In the embodiment omitting the buffer layer 16, Young's modulus of the first layer 241 and/or the second layer 242 of the optical filter layer 24 can be adjusted to be lower than that in the embodiment having the buffer layer 16. In some embodiments, the adjustment of the Young's modulus of the first layer 241 and/or the second layer 242 in the laminating structure of the optical filter layer 24 can be achieved, for example, by tuning film deposition parameters so that a layer with desired mechanical property, e.g., Young's modulus, can be obtained. In some embodiments, the grain size of the first layer 241 in the first unit is greater than the grain size of the first layer 243 in the second unit. In some embodiments, a refractive index of the first layer 241 in the first unit may be different from a refractive index of the first layer 243 in the second unit. A refractive index of the second layer 242 in the first unit may be different from a refractive index of the second layer 244 in the second unit.

In addition to the first unit and the second unit, the laminating structure may further include more subsequent repeating units having a first layer and a second layer. The grain size of the first layer 241 in the first unit may be greater than the grain size of the first layer in the subsequent repeating units. The relatively great grain size of the first layer 241, e.g., a relatively small Young's modulus of the first layer 241, in the first unit is disposed in the bottom of the optical filter layer 24 to suppress the stress transferring from the microlens 13 to the subsequent repeating units of the optical filter layer 24. The material of the first layer 241 in the first unit and the first layer 243 in the second unit may include, for example, $TiO_2$, $Nb_2O_5$, or $Ta_2O_3$ or other oxides. The material of the second layer 242 in the first unit and the second layer 244 in the second unit may include, for example, $MgF_2$, $SiO_2$ or other oxides.

Still referring to FIG. 2, the optical package 2 further includes a constraining layer 25 disposed between the optical filter layer 24 and the microlens 13. A CTE of the optical filter layer 24 is greater than a CTE of the constraining layer 25. For the materials of the constraining layer 25 in the optical package 2, please refer to the corresponding components described with respect to FIG. 1.

Figure 3:
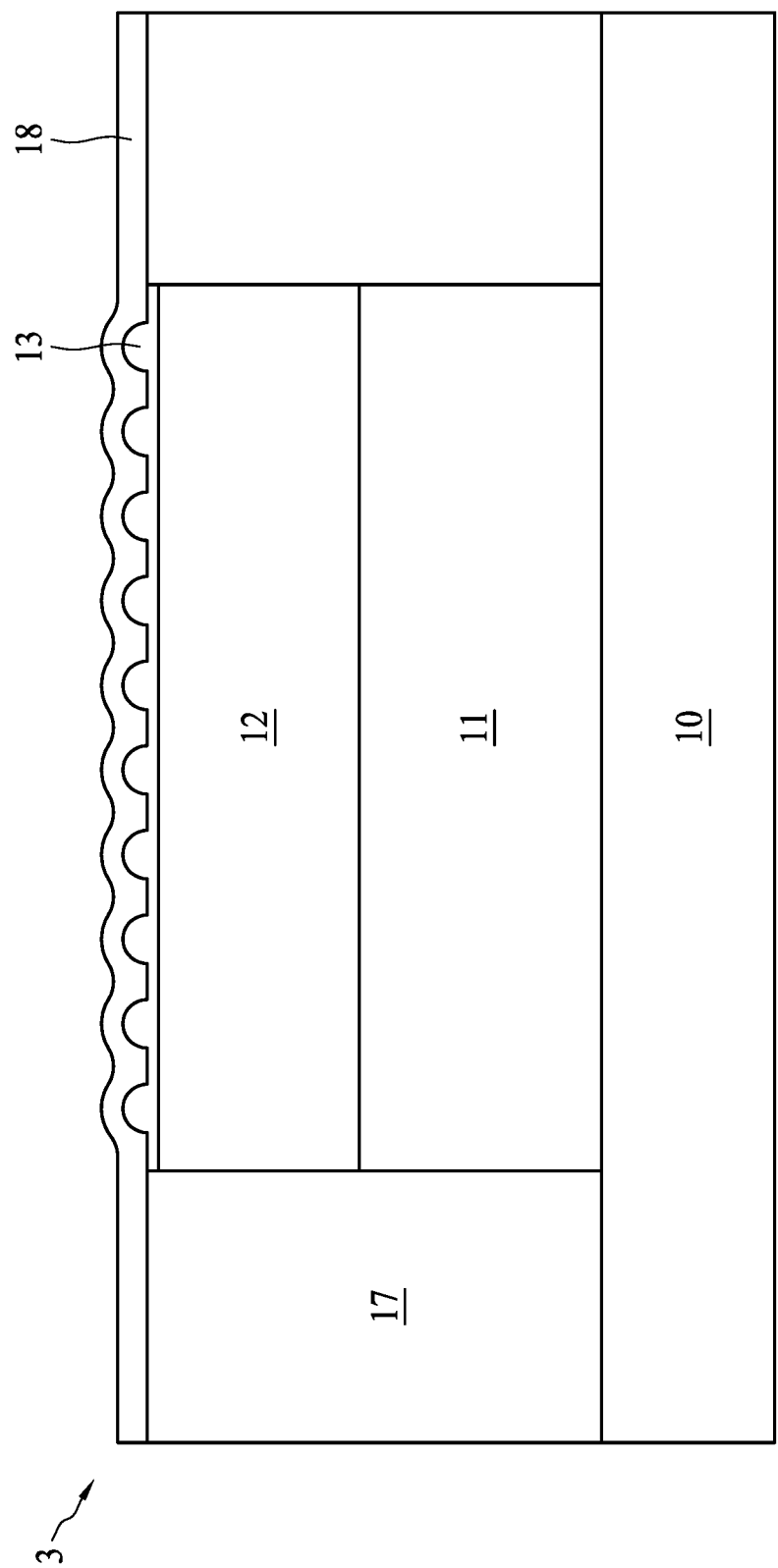
FIG. 3 illustrates a cross-sectional view of an optical package in accordance with some embodiments of the present disclosure.

FIG. 3 illustrates a cross-sectional view of an optical package 3 in accordance with some embodiments of the present disclosure. Referring to FIG. 3, the optical package 3 includes a substrate 10, an image sensor 11, a collimating layer 12, and a microlens 13 as illustrated in FIG. 1. The optical package 3 further includes an encapsulant 17 and an optical filter structure 18. The optical filter structure 18 is disposed directly over the microlens 13. Furthermore, the optical filter structure 18 is conformal to a topography of the microlens 13. In some embodiment, the optical filter structure 18 may include the optical filter layer 14 and the buffer layer 16 as previously described in FIG. 1. In some embodiment, the optical filter structure 18 may include the optical filter layer 24 as previously described in FIG. 2. In some embodiments, the optical filter structure 18 may include the optical filter layer 14, the constraining layer 15, and the buffer layer 16 as previously described in FIG. 1. In some embodiment, the optical filter structure 18 may include the optical filter layer 24 and the constraining layer 25 as previously described in FIG. 2.

The encapsulant 17 disposed on the substrate 10 encapsulates the image sensor 11, the collimating layer 12, and the microlens 13. The optical filter structure 18 extends along a top surface of the encapsulant 17. The encapsulant 17 may include insulation or dielectric material. Alternatively, the encapsulant 17 may be made of molding material.

FIG. 4 illustrates a cross-sectional view of an optical package 4 in accordance with some embodiments of the present disclosure. Referring to FIG. 4, in contrast to the optical package 3 in FIG. 3, an optical filter structure 28 is disposed between the collimating layer 12 and the image sensor. In some embodiment, the optical filter structure 28 may include the optical filter layer 14 and the buffer layer 16 as previously described in FIG. 1. In some embodiment, the optical filter structure 28 may include the optical filter layer 24 as previously described in FIG. 2. In some embodiments, the optical filter structure 28 may include the optical filter layer 14, the constraining layer 15, and the buffer layer 16 as previously described in FIG. 1. In some embodiment, the optical filter structure 28 may include the optical filter layer 24 and the constraining layer 25 as previously described in FIG. 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between the highest point and the lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical package, comprising:
a substrate;
an image sensor disposed on the substrate;
a microlens having a first Young's modulus disposed on the image sensor;
an optical filter layer having a second Young's modulus disposed on the microlens;
a constraining layer disposed between the optical filter layer and the microlens;
a buffer layer having a third Young's modulus disposed on the constraining layer;
wherein the third Young's modulus is greater than the first Young's modulus and smaller than the second Young's modulus,
wherein a width-to-height ratio of the microlens is between about 6 and 7.

2. The optical device of claim 1, wherein the constraining layer comprises a fourth Young's modulus greater than the third Young's modulus.

3. The optical package of claim 1, wherein the constraining layer comprises a fourth Young's modulus, the fourth Young's modulus is closer to the second Young's modulus than to the first Young's modulus.

4. The optical package of claim 1, wherein the constraining layer comprises a fourth Young's modulus greater than the first Young's modulus.

5. The optical package of claim 1, wherein a Coefficient of Thermal Expansion (CTE) of the microlens is greater than a CTE of the constraining layer.

6. The optical package of claim 1, wherein a CTE of the constraining layer is closer to a CTE of the optical filter layer than a CTE of the microlens.

7. The optical package of claim 1, wherein a CTE of the buffer layer is greater than a CTE of the constraining layer.

8. The optical package of claim 1, wherein the optical filter layer is conformal to a topography of the microlens.

9. The optical package of claim 1, wherein the constraining layer comprises a top surface and a bottom surface, the top surface and the bottom surface being conformal to a topography of the microlens.

10. The optical package of claim 1, wherein the optical filter layer comprises a laminating structure, wherein the laminating structure includes a first layer having a first refractive index and a second layer having a second refractive index, and the first refractive index is different from the second refractive index.

11. The optical package of claim 1, wherein the optical filter layer comprises an infrared cut filter, the buffer layer comprises doped metal oxide.

12. The optical package of claim 1, further comprising a collimating layer between the image sensor and the microlens.

13. The optical package of claim 1, wherein a CTE of the microlens is greater than a CTE of the buffer layer.

14. The optical package of claim 1, wherein the buffer layer having a top surface and a bottom surface opposite to the top surface, both the top surface and the bottom surface conform to a topography of the microlens.

15. The optical package of claim 1, further comprising an encapsulant disposed on the substrate and encapsulating the image sensor and the microlens.

16. The optical package of claim 15, wherein the optical filter layer extends along a top surface of the encapsulant.

17. The optical package of claim 1, wherein the constraining layer has a thickness less than or equal to about 50 nm.

18. The optical package of claim 1, wherein the constraining layer is configured to constrain the thermal expansion of the microlens.

19. An optical package, comprising:
a substrate;
an image sensor disposed on the substrate;
a microlens having a first Young's modulus disposed on the image sensor;
an optical filter layer having a second Young's modulus disposed on the microlens;
a constraining layer disposed between the optical filter layer and the microlens;
a buffer layer having a third Young's modulus disposed on the constraining layer;
wherein the third Young's modulus is greater than the first Young's modulus and smaller than the second Young's modulus,
wherein the optical filter layer comprises a laminating structure with repeating units of a first layer and a second layer, wherein a grain size of the first layer in a first repeating unit is greater than a grain size of the first layer in subsequent repeating units.

\* \* \* \* \*